Nov. 19, 1968 A. B. GREBENE 3,412,295

MONOLITHIC STRUCTURE WITH THREE-REGION COMPLEMENTARY TRANSISTORS

Filed Oct. 19, 1965

INVENTOR
Alan B. Grebene

BY Connolly and Hutz
ATTORNEYS

United States Patent Office 3,412,295
Patented Nov. 19, 1968

3,412,295
MONOLITHIC STRUCTURE WITH THREE-REGION COMPLEMENTARY TRANSISTORS

Alan B. Grebene, Waterford, N.Y., assignor to Sprague Electric Company, North Adams, Mass., a corporation of Massachusetts Filed Oct. 19, 1965, Ser. No. 497,830
4 Claims. (Cl. 317—234)

ABSTRACT OF THE DISCLOSURE

Complementary transistors are provided within dielectrically isolated pockets of a substrate which have upper zones of low conductivity and lower zones of high conductivity. The upper zones are of one conductivity type and one of the lower zones is of the other conductivity type. Regions of both conductivity types are provided in the upper zones such that upper and lower zones of the same conductivity provide a transistor collector in a first pocket whereas the lower zone of the second pocket provides a collector and its upper zone provides a base of a complementary transistor.

This invention relates generally to a monolithic semiconductor structure and more particularly to complementary transistors, dielectrically isolated within a monolithic structure, and a method of making the same.

The development of monolithic integrated circuits has been greatly hampered by the lack of compatible pnp-npn complementary transistors. These are difficult to provide in monolithic structures for a number of reasons.

For example, the use of a common substrate provides increased stray capacitance. Furthermore, the base of the planar pnp transistor is normally enclosed at the surface of the monolithic chip by a low impurity portion of the collector which results in leakage currents due to the oxide induced surface inversion layer.

It is an object of this invention to provide a monolithic structure having complementary transistors isolated from each other and a common substrate by a dielectric layer.

It is a further object of this invention to provide a process of fabricating compatible pnp-npn complementary transistors within a monolithic structure.

These and other objects of this invention will become more apparent upon consideration of the following description taken together with the accompanying drawings in which.

Figure 1:
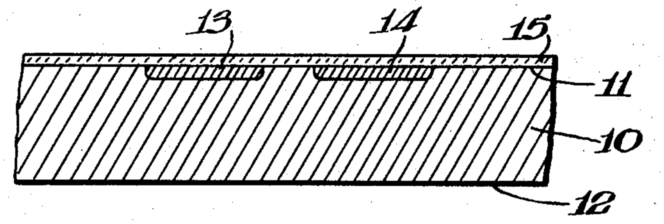
FIGURES 1–3 are schematic sectional diagrams illustrative of a method of fabricating dielectrically isolated pockets having dual conductivity zones.

In its broadest scope, the invention provides a semiconductor comprising a substrate having a plurality of dielectrically isolated pockets of monocrystalline semiconductive material, at least two of said pockets having dual conductivity zones, a first of said dual zone pockets having an upper and lower zone of low and high conductivity respectively of one conductivity type, said upper zone of said first pocket having a base region of the other conductivity type therein, said base region having an emitter region of said one conductivity type therein, said emitter and said base region providing with said upper and lower zone one type of transistor, said upper and said lower zone of said first pocket being the collector of said one transistor.

A second of said dual zone pockets having an upper zone of low conductivity of said one conductivity type and a lower zone of high conductivity of said other conductivity type, said upper zone of said second pocket having an emitter region and a collector contact region of said other conductivity type adjacent on upper surface thereof, said collector contact region penetrating said upper zone of said second pocket to the lower zone therein, said emitter and said lower zone providing with said upper zone a transistor complementary to said one transistor, said upper zone being a base and said lower zone being a collector of said complementary transistor.

Briefly the process for making a semiconductor in accordance with this invention comprises the steps of forming a monocrystalline wafer having low conductivity of one conductivity type, forming regions of high conductivity adjacent a first major surface of said wafer, at least one of said regions being of said one conductivity type and at least one of said regions being of the other conductivity type, forming said first major surface into a plurality of mesas, at least two of said mesas being dual zone mesas each having one of said regions therein, forming a dielectric layer over said mesas, forming a substrate over said dielectric layer, removing the opposed major surface of said wafer to form a further major surface substantially coplanar with the bottom of said mesas thereby exposing the dielectric layer at said bottom and providing pockets isolated from each other and said substrate by said dielectric layer, at least two of said pockets having dual conductivity zones, said dual zone pockets corresponding to said dual zone mesas, a first of said dual zone pockets having an upper zone of low conductivity and a lower zone of high conductivity of said one conductivity type, a second of said dual zone pockets having an upper zone of low conductivity of said one conductivity type and a lower zone of high conductivity of said other conductivity type, forming within said second pocket a collector contact region of said other conductivity type, said collector contact region penetrating the upper zone of said second pocket and contacting the lower zone therein, forming a region having high conductivity of the said other conductivity type in the upper zones of said first and said second pockets to provide a base and emitter region respectively therein, and forming an emitter region having high conductivity of said one conductivity type in said base region of said first pocket.

Referring now to the drawings and more particularly to FIGURE 1 thereof wherein is shown a semiconductor wafer 10 having a first major surface 11 and an opposed major surface 12. Spaced apart regions 13 and 14 are also shown, adjacent the first major surface 11 and underlying an oxide coating 15.

In the preferred embodiment, the structure illustrated in FIGURE 1 is constructed in a conventional manner by first forming a monocrystalline semiconductor wafer 10 of silicon or the like having low N-type conductivity of, for example, $10^{15}$ to $10^{16}$ atoms/cm.$^3$ impurity concentration. Thereafter a masking coating, not shown, of silicon dioxide or the like is grown over the wafer. A first opening is provided in the coating and a region or zone 13 of high N-type conductivity is formed in the wafer 10 by diffusing an N-type impurity having a slow diffusant constant, such as antimony or the like, into the exposed surface. A further oxide coating is then provided, a new opening made, and a region or zone 14 of high P-type conductivity is also formed within wafer 10. The latter zone 14 may be formed by diffusion of a preferably slow P-type diffusant such as indium which has a diffusion constant of approximately $.7 \times 10^{-12}$ cm.$^2$/sec. at 1200° C. Boron, which has a diffusant constant of $2.5 \times 10^{-12}$ cm.$^2$/sec. at 1200° C. is also suitable in this case.

Both regions 13 and 14, although different in conductivity type, have high conductivity, for example, a surface concentration of $10^{19}$ atoms/cm.$^3$. Furthermore, although both zones are initially diffused to a depth of approximately 2 microns, the P-type zone 14 will penetrate deeper than the N-type zone 13 during successive heating cycles since the indicated P-type impurities diffuse faster than antimony, which has a diffusant constant of $.16 \times 10^{-12}$ cm.$^2$/sec. at 1200° C.

Figure 2:
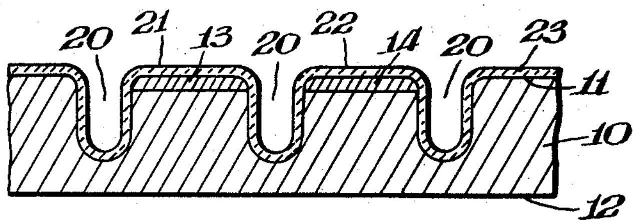

Following the completion of both zones 13 and 14, an overall masking coat 15 of silicon dioxide or the like is formed over wafer 10. A suitable thickness of .6 micron may be grown by thermal oxidation or the like. Thereafter, isolation moats 20 are formed to provide mesas 21 and 22 enclosing the zones 13 and 14 as illustrated in FIGURE 2.

The moats 20 may be formed, for example, by etching selected portions of wafer 12 using layer 15 as a mask. In this way cuts or moats 20 may be made to extend to a suitable depth of, for example, approximately 12 microns. The moats 20 provide mesas 21 and 22 whose upper portions are zones 13 and 14 respectively and whose lower portions are a segment of wafer 10. The mesas 21 and 22 may be formed by any suitable means. Thus parallel moats may be formed across a narrow wafer or rectangular or circular moat patterns may be employed. In any case, after forming of mesas 21 and 22 an isolating coating or layer 23 of silicon dioxide or the like is grown over surface 11 and within the moats 20.

Figure 3:
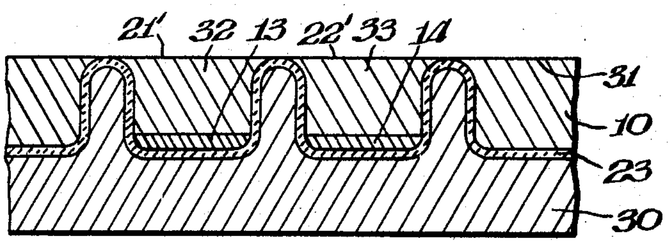

A support substrate 30 of polycrystalline silicon or the like is subsequently deposited or grown over dielectric layer 23. The structure is then inverted and the opposed major surface 12 is removed by etching or the like to provide a new surface 31 substantially coplanar with the bottom of moats 20, thereby providing pockets 21′ and 22′ which are isolated from each other and the substrate by dielectric layer 23, as shown in FIGURE 3.

Since pockets 21′ and 22′ are the inverted mesas 21 and 22 they contain dual zones. Thus, each has an upper zone 32 and 33 respectively of low N-type conductivity, corresponding to the conductivity of the wafer 10, and each has a lower zone 13 and 14 of high conductivity. Zone 13 is, of course, N-type whereas zone 14 is P-type, since these correspond to the diffused zones 13 and 14.

Figure 4:
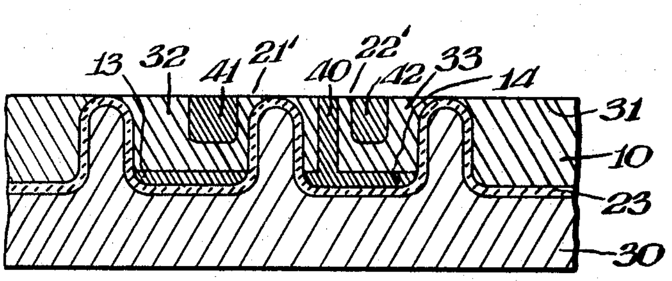
FIGURE 4 is a schematic sectional diagram of the structure of FIGURE 3 illustrating a further step in the process of providing complementary transistors in a monolithic chip.
Figure 5:
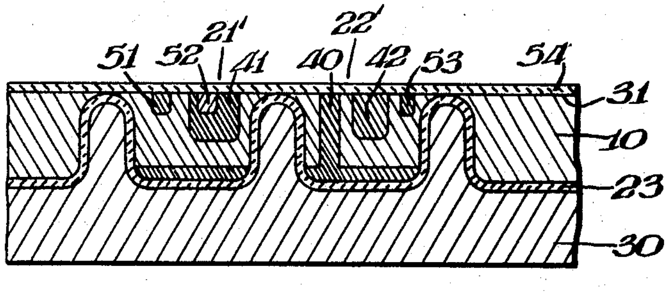
FIGURE 5 is a schematic sectional diagram of a monolithic structure having dielectrically isolated complementary transistors.

Once the dielectrically isolated dual zone pockets 21′ and 22′ have been prepared, a further masking coat, not shown, such as silicon dioxide is formed over surface 31 and a collector contact region 40, shown in FIGURE 4, is formed within upper zone 33 of pocket 22′. The collector contact 40 is provided by the diffusion of P-type impurities. Thus, boron or the like is deposited, in a suitable opening in the masking layer, on surface 31 and diffused to a depth sufficient to contact lower zone 14. This then provides a contact region 40 from surface 31 of the structure to zone 14.

Accordingly, P-type regions 41 and 42, having high conductivity, are then provided in upper zones 32 and 33 respectively. The regions 41 and 42 are simultaneously formed to a depth of approximately 3 microns by the diffusion of a P-type impurity such as boron or the like through suitable openings in the masking layer.

Region 41 provides the base of an npn transistor with zones 13 and 32 making the collector of the same, while region 42 provides the emitter of a pnp transistor having zone 33 as a base and zone 14 along with region 40 as a collector.

Thereafter, a masking coat (not shown) is again provided over the structure. Suitable openings are made to surface 31 and high conductivity N-type regions 51, 52 and 53 are simultaneously formed within the upper zones 32, 33 and base region 41 by the diffusion of an N-type impurity, such as phophorus or the like. The latter regions 51, 52 and 53 provide a collector contact region 51 and emitter region 52 of an npn transistor in pocket 21′ and a base contact region 53 of a pnp transistor in pocket 22′.

The indicated forming of similar regions by simultaneous diffusion provides a distinct advantage over the prior art, in that it reduces the number of process steps and provides additional process control.

A final protective coat 54 of silicon dioxide or the like is then provided over the monolithic structure and suitable connections, not shown, are made by conventional means. For example, openings may be made in layer 54 over the various regions, and aluminum or gold or the like deposited on surface 33 to provide low resistance contacts. Thereafter leads may be attached to the metallized areas of the regions for interconnection to other components.

It should be noted, that although the regions are shown in sectional views to generally illustrate their depth, various configurations are possible. For example, since the collector must carry a reasonable current it is generally desirable to provide a large contact area. Thus, regions 40 and 51 may be such as to provide a large substantially rectangular region at surface 33 or may also be U-shaped regions which enclose the other regions 41, 52 and 42, 53 respectively.

Many other modifications are also possible. Thus, for example, various dielectric compounds of silicon may be suitable as an isolation layer. In addition, other semiconductive materials may be suitable and, of course, materials other than silicon may provide a suitable substrate.

Furthermore, it should be understood that many modifications of this invention may be made without departing from the spirit and scope herein and that the invention is not to be limited except as defined in the appended claims.

What is claimed is:

1. A monolithic semiconductor structure comprising a substrate having at least two dielectrically isolated pockets of semiconductive material, a first of said pockets having an upper and lower zone of low and high conductivity respectively and of one conductivity type for providing a collector of a first transistor, a second of said pockets having an upper zone of low conductivity and said one conductivity type and a lower zone of high conductivity and the other conductivity type for providing a base and collector respectively of a second transistor which is complementary to said first transistor, said upper zones having regions of substantially equal depth and of high conductivity and said other conductivity type for providing a base region in said first pocket and an emitter region in said second pocket, said base region having an emitter region therein of high conductivity and the other conductivity type, and said second pocket having a collector contact region of high conductivity and the other conductivity type which extends from the surface of said second pocket through its upper zone to its lower zone.

2. A monolithic semiconductor structure as claimed in claim 1 wherein each of said upper zones includes a contact region of high conductivity and the other conductivity type, said contact regions being of substantially equal depth with said emitter of said first transistor and providing a collector contact in said first pocket and a base contact in said second pocket.

3. A monolithic semiconductor structure as claimed in claim 1 wherein said one conductivity type is N-type and said other conductivity type is P-type.

4. A monolithic semiconductor as claimed in claim 1 wherein said semiconductive material is monocrystalline silicon, said dielectric layer is a dielectric compound of silicon and said substrate is polycrystalline silicon.

(References on following page)

References Cited

UNITED STATES PATENTS

| | | | |
|---|---|---|---|
| 3,152,294 | 10/1964 | Siebertz et al. | 317—235 |
| 3,165,430 | 1/1965 | Hugle | 317—235 |
| 3,260,902 | 7/1966 | Porter | 317—235 |
| 3,332,137 | 7/1967 | Kenney | 317—235 |

OTHER REFERENCES

Electronics Review, vol. 37, no. 17, June 1, 1964, p. 23.

Electronic Design, vol. 12, no. 8, Apr. 13, 1964, pp. 12–14.

JAMES D. KALLAM, *Primary Examiner.*